United States Patent [19]

Yoshizaki

[11] E Patent Number: Re. 32,178

[45] Reissued Date of Patent: Jun. 10, 1986

[54] PROCESS FOR PRODUCING COMPOUND BASED SUPERCONDUCTOR WIRE

[75] Inventor: Kiyoshi Yoshizaki, Sagamihara, Japan

[73] Assignee: Mitsubishi Denki K.K., Tokyo, Japan

[21] Appl. No.: 577,906

[22] Filed: Feb. 7, 1984

Related U.S. Patent Documents

Reissue of:

[64] Patent No.: 4,363,675
Issued: Dec. 14, 1982
Appl. No.: 264,325
Filed: May 18, 1981

[30] Foreign Application Priority Data

May 19, 1980 [JP] Japan ..... 55-66166

[51] Int. Cl.[4] ..... H01L 39/24
[52] U.S. Cl. ..... 148/11.5 P; 29/599
[58] Field of Search ..... 148/11.5 P, 11.5 F; 29/599

[56] References Cited

U.S. PATENT DOCUMENTS

| | | | |
|---|---|---|---|
| 3,290,186 | 12/1966 | Rosi et al. | 148/11.5 P |
| 3,815,224 | 6/1974 | Pickus et al. | 29/599 |
| 3,905,839 | 9/1975 | Hashimoto | 29/599 |
| 3,945,859 | 3/1976 | van Beijnen | 148/11.5 R |
| 4,127,452 | 11/1978 | Martens | 29/599 |
| 4,190,701 | 2/1980 | Howe et al. | 29/599 |

FOREIGN PATENT DOCUMENTS

| | | |
|---|---|---|
| 1004179 | 9/1965 | United Kingdom . |
| 1070691 | 6/1967 | United Kingdom . |
| 1137427 | 12/1968 | United Kingdom . |
| 1177728 | 1/1970 | United Kingdom . |
| 1209490 | 10/1970 | United Kingdom . |
| 1370257 | 10/1974 | United Kingdom . |

OTHER PUBLICATIONS

Tsuei, C. C., *Applied Physics Letters*, vol. 25, No. 5, Sep. 1, 1974, p. 318.

Flukiger, R. et al., IEEE Transactions on Magnetics, vol. Mag. 15, No. 1, Jan. 1979, p. 689.

*Primary Examiner*—Wayland Stallard
*Attorney, Agent, or Firm*—Sughrue, Mion, Zinn, Macpeak & Seas

[57] ABSTRACT

A process for producing a compound-based semiconductor wire having a high mechanical strength and which can be coiled so as to be cooled efficiently. A starting composition is formed by blending at least one metal powder selected from among Nb-based and V-based particles having at least a partial surface coating of an alloy or metal selected from Cu-Sn-based and Ga-based metal layers with at least one of Cu-based, Sn-based, Ga-based, Cu-Sn-based and Cu-Ga-based metal or alloy powder. The cross-sectional area of the composition is reduced followed by a heat treatment. The composition is then drawn into a wire of desired diameter.

8 Claims, 6 Drawing Figures

PROCESS FOR PRODUCING COMPOUND BASED SUPERCONDUCTOR WIRE

Matter enclosed in heavy brackets [ ] appears in the original patent but forms no part of this reissue specification; matter printed in italics indicates the additions made by reissue.

BACKGROUND OF THE INVENTION

The present invention relates to a process for producing a compound-based superconductor wire.

Superconductor wires made of intermetallic compounds such as $Nb_3Sn$ and $V_3Ga$ are characterized by a number of continuous fibers of intermetallic compound which are buried in the matrix phase. Wires having such a construction exhibit a high superconductivity but because of the intermetallic compound used, they are inherently brittle and permit an elongation of only less than 1.0% and are very vulnerable to mechanical tensile stress and bending stress. Therefore, the reliability of manufacturing such superconductor wires and winding them into a coil is low, and what is more, they cannot be cooled with liquid helium effectively.

In recent years, attempts have been made to produce a superconductor by using the "tunnel effect", also known as the proximity effect or filament effect, in which a number of very fine, discontinuous fibers of superconducting compounds are buried in the matrix phase very close to each other. Unfortunately, the superconducting characteristics of wire produced by this method are too low to satisfy practical requirements. A superconductor wire made of discontinuous fibers of a compound such as $Nb_3Sn$ is produced typically by a process in which Cu and Nb are melted to form an ingot with spherical or acicular particles of Nb scattered within the Cu matrix and the ingot is drawn to the final dimensions and Sn is diffused into the Cu matrix from its surface or a process in which a Cu-based metal tube is filled with a mixture of Nb and Cu powders and the tube is drawn to the final dimensions and Sn is diffused into the Cu matrix from its surface to form a coating of $Nb_3Sn$ on the Nb fibers. In the former method, if Cu is mixed with more than 25 vol % of Nb, it becomes difficult to melt and cast the mixture in a mold, and an ingot containing a sufficient percentage of Nb to provide improved superconducting characteristics cannot be formed. In addition, the casting is very difficult to draw. For these reasons, it has been practically impossible to make a wire having good superconducting characteristics using this method. In the latter method, the Nb powder in the Cu matrix does not form a sufficiently elongated fiber upon drawing and consequently it often breaks during the drawing step and thereby fails to provide a structure wherein a number of discontinuous Nb fibers elongated in the drawing direction are buried within the Cu matrix. Therefore, both processes have a low reliability and are capable of producing only a wire having poor superconducting characteristics.

SUMMARY OF THE INVENTION

An object of the invention is to provide a process for producing a $Nb_3Sn$ or $V_3Ga$ compound-based superconductor wire that has great mechanical strength, can be cooled efficiently and which has improved superconducting characteristics.

To achieve this object, a composition wherein at least one metal powder selected from Nb-based and V-based particles at least a part of the surface of which is covered with at least one layer selected from the group consisting of Cu-based, Sn-based and Ga-based metal layers blended or otherwise brought into intimate contact with at least one metal or alloy powder selected from Cu-based, Sn-based, Ga-based, Cu-Sn-based and Cu-Ga-based particles is subjected to a treatment of reducing the cross-sectional area of the composition and a heat treatment.

Using the process of the invention, a compound-based superconductor wire that has great mechanical strength, which can be cooled efficiently and which has improved superconducting characteristics is obtained.

BRIEF DESCRIPTION OF THE DRAWINGS

The invention will now be described in detail with reference to the following examples taken in conjunction with the accompanying drawings, wherein.

DESCRIPTION OF THE PREFERRED EMBODIMENTS

Preferred embodiments of the invention will be described with reference to specific examples.

EXAMPLE 1

Figure 1:
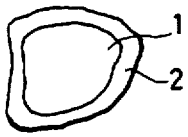
FIG. 1 schematically shows a cross-section of a composite particle according to a preferred embodiment of the invention.

Niobium particles (generally indicted at 1 in FIG. 1) having an average size of about 40 μm whose surface was cleaned by a chemical treatment were covered with a copper layer 2 of a thickness of about 5 μm by electrodeposition. The resulting composite particles (as already mentioned, a particle having at least two metal layers is referred to as a composite particle) was blended with copper particles in a ratio of 1:0.6. The blend was subjected to a preliminary forming with a rubber press and further formed into a bar having a diameter of 30 mm and a length of 200 mm. The bar was sintered continuously with a hot press in a vacuum at 950° C. to thereby form a metallurgically integral composite metal bar wherein Nb particles were scattered within the Cu matrix. The space factor of Nb in the bar was about 50 vol %.

Figure 2:
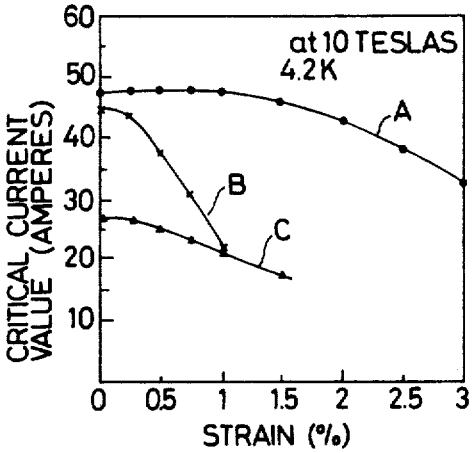
FIG. 2 is a chart showing the critical current characteristics of a $Nb_3Sn$ superconductor wire produced according to a preferred embodiment of the invention and two $Nb_3Sn$ superconductor wires produced by the conventional process.

The bar was cold-drawn into a 0.3 mmϕ wire by a conventional technique. No annealing was performed during the drawing step. The wire was covered with a tin layer formed by electroplating and subsequently heated at 700° C. for 50 hours to diffuse tin and form a $Nb_3Sn$ coating on the surfaces of Nb fibers. Microscopic observation of a cross-section of the resulting $Nb_3Sn$ wire revealed the presence of $Nb_3Sn$ fibers elongated in the longitudinal direction of the wire. The diameter of each fiber and the average distance between adjacent compound layers were on the order of several hundred angstroms. The $Nb_3Sn$ wire was placed in liquid helium and its critical current characteristics were measured by applying to it a biasing magnetic field (10 teslas) at 4.2° K. and a bending strain. The results are shown in FIG. 2 by a curve A. For comparison, a very thin commercial wire composed of a number of continuous fibers and a wire composed of discontinuous fibers produced by the conventional process were subjected to the same test under the same conditions. The results are shown in FIG. 2 by curves B and C, respectively.

FIG. 2 shows that the wire produced according to the invention had a larger critical current for zero strain than the very thin commercial wire composed of a number of continuous fibers. The value of critical current for zero strain of the wire of the invention was substantially maintained even when the strain was about 2%, and it decreased only gradually as greater strains were applied. The critical current for the very thin commercial wire with a number of continuous fibers dropped suddenly when the strain became more than 0.5%. The wire composed of discontinuous fibers exhibited low critical currents for all levels of strain. As is clear from these data, the wire produced by the process of this invention exhibited much better superconducting and mechanical characteristics than the conventional products.

EXAMPLE 2

Niobium particles having an average size of about 40 μm whose surface was cleaned by a chemical treatment were covered with a copper layer of a thickness of about 9 μm by vapor deposition. The resulting composite particles were pressed into a bar 150 mm in diameter and 400 mm long. The bar was hot-extruded (extrusion ratio: 10, extrusion temp.: 1050° C.) into a tubular form (OD: 50 mm, ID: 15 mm). A metallurgical integral composite metal tube was thus provided with elongated niobium particles scattered within the Cu matrix. The space factor of Nb in the tube was about 50 vol %.

A 14.5 mmϕ bar was fitted into the composite metal tube which was fitted into a tantalum tube (OD: 53.8 mm, ID: 50.2 mm) which was in turn fitted into a copper tube (OD: 76 mm, ID: 54 mm). The resulting tubular structure was cold-drawn to a 1.4 mmϕ wire by a conventional technique. The wire was heated at 700° C. for 50 hours to form a $Nb_3Sn$ superconductor wire having a stabilizing Cu layer. The wire was then covered with an insulating coating and wound into a coil (OD: 200 mm, ID: 100 mm). When a magnetic flux density of 12 teslas was generated with a combination of the coil and a bias coil, the characteristics of the $Nb_3Sn$ coil were almost as good as those of a short sample. No such small-scale and high-performance coil could be fabricated easily with the conventional $Nb_3Sn$ wire.

EXAMPLE 3

Figure 3:
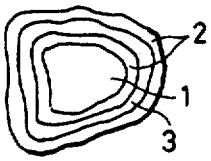
FIGS. 3 to 6 show schematically a cross-section of composite particles produced according to other embodiments of the invention.

Niobium particles (generally indicated at 1 in FIG. 3) having an average size of about 40 μm whose surface was cleaned by a chemical treatment were covered sequentially with a copper layer 2, a tin layer 3 and a copper layer 2 by electrodeposition. Each layer had a thickness of about 40 μm. The resulting composite particles were fitted into a tantalum tube (OD: 20 mm, ID: 18 mm) which was fitted into a copper tube (OD: 28 mm, ID: 20.2 mm). The resulting tubular structure was cold-drawn into a wire having a square cross-section (4×4 mm) by a conventional technique. The wire was given a heat treatment as described above to provide a $Nb_3Sn$ wire of a square cross-section having a stabilizing copper layer.

The critical current characteristics of the wire were measured by applying various degrees of bending at 4.2° K. under a magnetic flux density of 10 teslas. The value of critical current decreased little even when a bending stress causing about 2% strain was applied. This indicated a large current-carrying capacity, high ability to be cooled and good mechanical characteristics of the wire produced by the process of this invention.

EXAMPLE 4

Figure 4:
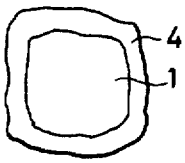

Niobium particles (generally indicated at 1 in FIG. 4) having an average size of about 40 μm whose surface was cleaned by a chemical treatment were covered with an alloy (Cu-13 wt % Sn) layer 4 of a thickness of about 10 μm by electroplating. The resulting composite particles were pressed into a bar 150 mm in diameter and 400 mm long. The bar was hot-extruded (extrusion ratio: 22, extrusion temp.: 550° C.) into a wire (OD: 32 mm). The wire was metallurgically integral and had a structure wherein elongated niobium particles were scattered within the Cu-Sn matrix. The wire was fitted into a tantalum tube (OD: 37 mm, ID: 34 mm) which was fitted into a copper tube (OD: 46 mm, ID: 38 mm). The resulting tubular structure was subjected to repeated cycles of cold drawing and annealing (400° C.×1 hr) to form a 1.4 mmϕ wire. The wire was then heated at 700° C. for 50 hours to provide a $Nb_3Sn$ superconductor wire having a stabilizing copper layer.

The wire was put in liquid helium and subjected to measurement of the critical current characteristics under the same conditions as in Example 1. The value of critical current for zero strain was maintained until the strain was about 0.2%. This indicated the very good mechanical characteristics of the wire.

It is to be noted that tubes could be subsequently reduced in their cross-sectional area only when they used niobium particles covered with Cu-Sn alloys containing 0.1 to 14 wt % or 50 to 100 wt % of tin.

EXAMPLE 5

Figure 5:
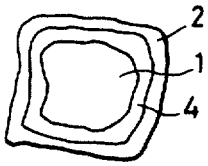
Figure 6:
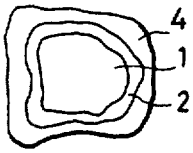

Composite particles as shown schematically in FIGS. 5 and 6 were drawn and heat-treated as in Example 4 to form $Nb_3Sn$ superconductor wires. They exhibited as good results in measurement of critical current characteristics as the wire produced in Example 4.

EXAMPLE 6

Vanadium particles having an average size of about 40 μm whose surface was cleaned with a chemical treatment were covered with an alloy (Cu-23 wt % Ga) layer of a thickness of about 10 μm by electroplating. The resulting composite particles were pressed into a bar 150 mm in diameter and 400 mm long. The bar was hot-extruded (extrusion ratio: 22, extrusion temp.: 500° C.) into a wire (OD: 32 mm). The wire was metallurgically integral and had a structure in which elongated vanadium particles were scattered in the Cu-Ga matrix. The wire was subjected to repeated cycles of cold-drawing and annealing (350° C.×1 hr) to form a 0.3 mmϕ wire. The wire was then heated at 650° C. for 50 hours to provide a $V_3Ga$ base superconductor wire.

The wire was put in liquid helium and subjected to a measurement of its critical current characteristics under the same conditions as in Example 1. The value of critical current for zero strain was maintained until the strain was about 0.2%. This indicated very good mechanical characteristics of the wire. It is to be noted that wires could be subsequently reduced in their cross-sectional area only when they used vanadium particles covered with Cu-Ga alloys containing 0.1 to 25 wt % or 50 to 100 wt % of gallium.

The scope of the invention is not limited to the foregoing examples and it can be applied with equal advantage to the manufacture of $V_3Si$, $Nb_3(Sn\text{-}In)$, $Nb_3(Sn\text{-}Ga)$, $Nb_3Al$ and other compound-based wires that can be produced by the same method as that for producing $Nb_3Sn$ and $V_3Ga$-based wires. In other words, Pb, Ge, Si, which are of the same group as Sn, and In and Al, which are of the same group as Ga, can also be diffused into the matrix phase as effectively as Sn and Ga to produce compound-based superconductor wires by the process of the invention.

Various modifications can be made to the processes of the invention described above. For example, inert elements can be added to base materials such as Nb, V, Cu, Sn and Ga, or Nb and Cu particles or Nb, Cu and Sn particles can be blended in a different manner for preparing composite particles. Also, Cu particles, Sn particles or Cu-Sn alloy particles can further be added to these composite particles. Still further, the method of making a shaped article of the composite particles can be changed. These modifications can be made without adversely affecting the characteristic features and advantages provided by the invention.

As described above, the process of the invention yields a $Nb_3Sn$ or $V_3Ga$ compound-based superconductor wire using Nb- or V-based composite particles wherein at least part of the surface of Nb- or V-based metal particles is covered with at least one layer selected from the group consisting of Cu-, Sn- and Ga-based metal layers. By so doing, a compound-based superconductor wire that has excellent mechanical characteristics such as high bending strength and tensile strength and which undergoes only a very small decrease in superconducting characteristics under stress can be manufactured very easily and in a consistent manner. In addition, because of its good mechanical properties, an electrical conductor of a shape that can be cooled with liquid helium effectively can be formed of the wire. Furthermore, the wire can be wound easily to form a compound-based superconducting coil having a high reliability and improved coil characteristics. The wire has a high industrial utility; for example, it makes possible the economical production of a magnet of high magnetic field strength. As a further advantage, the process of the invention facilitates the deposition of a high-purity copper of aluminum layer necessary for providing a wire that is stable and can be cooled with liquid helium with a high efficiency.

What is claimed is:

1. A process for producing a $Nb_3Sn$ or $V_3Ga$ compound-based superconductor wire comprising the steps of: forming a composition by blending at least one metal powder selected from the group consisting of Nb-based and V-based particles at least part of the surface of which is covered with at least one layer selected from the group consisting of [Cu-Sn-based] , *in the case of $Nb_3Sn$ compound-based superconductor wire, Cu-based and Sn-based, and in the case of $V_3Ga$ compound-based superconductor wire, Cu-based* and Ga-based, metal layers with at least one metal powder or alloy powder selected from the group consisting of Cu-based, Sn-based, Ga-based, Cu-Sn based and Cu-Ga-based *particles*; reducing the cross-sectional area of said composition; heat treating said composition; and drawing the heat-treated composition into a wire.

2. The process according to claim 1 wherein at least part of the surfaces of individual particles of said group consisting of Nb- and V-based metal particles is covered with an alloy layer selected from the group consisting of Cu-Sn-based and Cu-Ga-based alloy layers.

3. The process according to claim 1 or 2 wherein said metal powder comprises at least one metal powder selected from the group consisting of Nb- and [Ga-based] *v-based* particles at least a part of the surface of which is covered with at least one layer selected from the group consisting of Cu-based, Sn-based, Ga-based, Cu-Sn-based and Cu-Ga-based layers, said particles being further covered with at least one layer selected from the group consisting of Sn-based, Ga-based, Cu-Sn-based and Cu-Ga-based layers.

4. The process according to claim 1 or 2 wherein said Nb-based and V-based metal particles are blended with particles selected from the group consisting of Cu-based, Cu-Sn-based, Cu-Ga-based particles, Nb-based composite particles, and V-based composite particles by forming individual metal or alloy layers into a desired shape at a temperature of from room temperature to 1050° C. and sintering, whereupon part of all of said metal or alloy layers on surfaces of adjacent metal layers are joined together.

5. The process according to claim 1 or 2 wherein said Nb-based and V-based metal particles are blended with particles selected from the group consisting of Cu-based, Cu-Sn-based, Cu-Ga-based particles, Nb-based composite particles, and V-based composite particles by extrusion at an extrusion temperature of from room temperature to 1050° C. with an extrusion ratio of more than 2, whereupon part of all of said metal or alloy layers on surfaces of adjacent metal layers are joined together.

6. The process according to claim 1 or 2 wherein said at least one layer selected from the group consisting of Cu-Sn-based and Cu-Ga-based alloy layers contains a material selected from the group consisting of tin in one of a range of from 0.1 to 14 wt % and from 50 to 100 wt %, and gallium in one of a range of from 0.1 to 25 wt % and from 50 to 100 wt %.

7. The process according to claim 1 or 2 wherein said step of heat treating comprises sintering in a vacuum to form a metallurgically integral bar.

8. The process according to claim 1 or 2 wherein said step of heat treating comprises hot extrusion.

* * * * *